(12) United States Patent
Palizban et al.

(10) Patent No.: US 11,860,206 B2
(45) Date of Patent: Jan. 2, 2024

(54) LOAD-PULL TUNER

(71) Applicant: C-COM SATELLITE SYSTEMS INC., Ottawa (CA)

(72) Inventors: Ardeshir Palizban, Waterloo (CA); Suren Gigoyan, Waterloo (CA); Soroush Rasti Boroujeni, Waterloo (CA); Safieddin Safavi-Naeini, Waterloo (CA)

(73) Assignee: C-COM SATELLITE SYSTEMS INC., Ottawa (CA)

( * ) Notice: Subject to any disclaimer, the term of this patent is extended or adjusted under 35 U.S.C. 154(b) by 197 days.

(21) Appl. No.: 17/476,561

(22) Filed: Sep. 16, 2021

(65) Prior Publication Data

US 2022/0082599 A1 Mar. 17, 2022

Related U.S. Application Data (60) Provisional application No. 63/079,140, filed on Sep. 16, 2020.

(51) Int. Cl.
| | |
|---|---|
| *H03H 7/40* | (2006.01) |
| *G01R 27/32* | (2006.01) |
| *H01P 5/04* | (2006.01) |
| *H03H 7/38* | (2006.01) |

(52) U.S. Cl.
CPC .............. *G01R 27/32* (2013.01); *H01P 5/04* (2013.01); *H03H 7/38* (2013.01)

(58) Field of Classification Search
CPC .... H03H 7/38; H03H 7/40; H01P 5/04; H01P 1/203; H01P 1/2013; H01P 1/201; H01P 1/20; H01P 1/184; G01R 27/32
USPC ................................ 333/204, 205, 263, 253
See application file for complete search history.

(56) References Cited

U.S. PATENT DOCUMENTS 7,561,004 B1 * 7/2009 Tsironis ................ G01R 27/32
333/263

* cited by examiner

*Primary Examiner* — Stephen E. Jones
(74) *Attorney, Agent, or Firm* — Pearne & Gordon LLP (57) ABSTRACT

A load-pull tuner is disclosed herein. The tuner comprises a transmission line network and dielectrics positionable above the transmission line network. The transmission line network comprising a main transmission line and two stubs connected to the main transmission line, the two stubs being transmission lines. The main transmission line and the two stubs being tunable transmission lines. The load-pull tuner directly connect to a Ground-Signal-Ground (GSG) probe. The load-pull tuner may be used at higher reflection coefficients for phased-array system characterization.

16 Claims, 7 Drawing Sheets
(5 of 7 Drawing Sheet(s) Filed in Color)

LOAD-PULL TUNER

TECHNICAL FIELD

The present disclosure relates to load-pull tuner, and in particular to a Ka-band load-pull tuner for phased-array system characterization.

BACKGROUND

To design and test a phased-array transmitter for, for example, large millimetre-wave (mm-wave) active phased-array antennas, the power amplifier on various load conditions is characterized. In large mm-wave phased arrays, the antenna impedance can increase, and so the performance of the phased array chip may be tested at the presence of a load mismatch. However, achieving a high reflection coefficient at the probe tip is very challenging at the mm-wave. The high signal attenuation at these frequencies can result in low reflection coefficient at the probe tips.

Passive load-pull systems with complex low loss mechanical wave guide based tuners, waveguide based mechanical tuners, electronic tuners based on varactor diodes or electronic switches, and other compact load-pull systems have been proposed to characterize phased-array systems. However, these systems require extra cables for on-wafer characterization, limit the maximum achievable reflection coefficient, are bulky, are challenging to implement at mm-wave and sub mm-wave frequencies, have low impedance coverage, have high costs, and may be limited to RF frequencies which may require a wave-guide to coaxial cable transition to be used in an RF system.

Accordingly, a low-cost and compact solution for a phased-array system characterization that may be directly connected to an on-wafer Ground-Signal-Ground (GSG) probe is desired.

SUMMARY

In accordance with an embodiment of the present invention, a tuner is provided, the tuner comprising a transmission line network comprising a main transmission line and two stubs connected to the main transmission line, wherein the two stubs are transmission lines and wherein the main transmission line and the two stubs are tunable transmission lines; and dielectrics positionable above the transmission line network.

In the tuner, the dielectrics may include a dielectric for each of the main transmission line and the two stubs.

In the tuner, the main line and the two stubs are tunable by changing an electrical length of each of the main transmission line and the two stubs.

In the tuner, the electrical length of the main transmission line may be changed by varying a distance between a dielectric positioned above the main transmission line and the main transmission line.

In the tuner, the electrical length of each stub may be changed by varying a distance between a dielectric positioned above a respective stub and the respective stub.

The tuner may further comprise a connector for directly connecting to a ground probe.

The tuner may further comprising a connector for connecting to a port.

The tuner may be used for phased-array system characterization.

In another embodiment of the present invention, a load pull system for phased-array system characterization is provided, the load pull system comprising a tuner for maximizing the coverage of the Smith-Chart. The tuner comprising a transmission line network comprising a main transmission line and two stubs connected to the main transmission line, wherein the two stubs are transmission lines and wherein the main transmission line and the two stubs are tunable transmission lines; and dielectrics positionable above the transmission line network.

In the load pull system, the dielectrics may include a dielectric for each of the main transmission line and the two stubs.

In the load pull system, the main line and the two stubs are tunable by changing an electrical length of each of the main transmission line and the two stubs.

In the load pull system, the electrical length of the main transmission line may be changed by varying a distance between a dielectric positioned above the main transmission line and the main transmission line.

In the load pull system, the electrical length of each stub may be changed by varying a distance between a dielectric positioned above a respective stub and the respective stub.

The load pull system may further comprise a connector for directly connecting to a ground probe.

The load pull system may further comprise a connector for connecting to a port.

The load pull system may be for testing the phased-array transmitter.

BRIEF DESCRIPTION OF FIGURES

The patent or application file contains at least one drawing executed in color. Copies of this patent or patent application publication with color drawing(s) will be provided by the Office upon request and payment of the necessary fee.

Features and advantages of the present disclosure will become apparent from the following detailed description, taken in combination with the appended drawings, in which.

DETAILED DESCRIPTION

A load-pull tuner is disclosed herein. The load pull tuner may be used for phased-array system characterization. Such characterization may be used to design phased array transmitters for, for example, large mm-wave active phased-array antennas in high speed 5G backhaul and satellite communication. As recited above, when testing the performance of a phased-array system, it can be challenging to achieving a high reflection coefficient at the probe tip. The high signal attenuation at these frequencies may result in a low reflection coefficient at the probe tips. In order to maximize the load reflection coefficient, the losses in the signal path to the chip pad may be minimized.

The tuner of the present invention comprises a transmission line network and dielectrics positionable above the transmission line network. The transmission line network comprises a main transmission line and two stubs connected to the main transmission line, where the two stubs are transmission lines. The main transmission line and the two stubs may be tunable transmission lines. The load-pull tuner may directly connect to a GSG probe. The load-pull tuner may be used at higher reflection coefficients for phased-array system characterization.

Figure 1A:
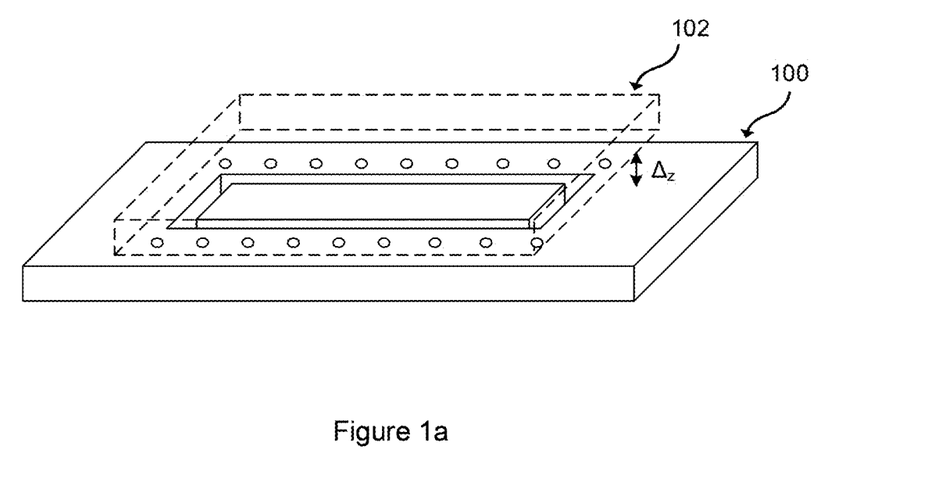
FIGS. 1a and 1b depicts a perspective view and a front view of a grounded co-planar waveguide (GCPW) line with a dielectric slab.
Figure 1B:
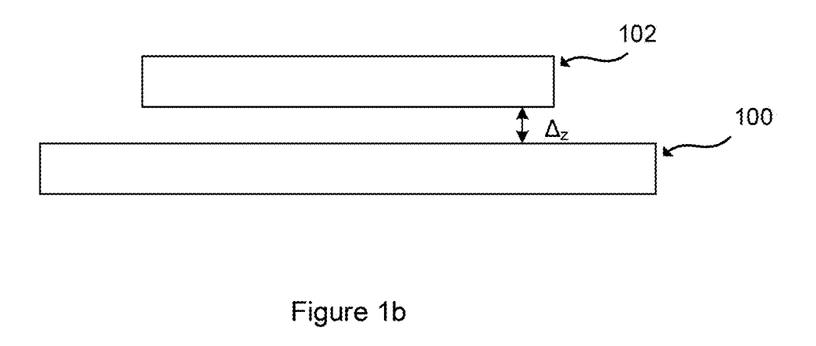

FIGS. 1a and 1b depict a grounded Co-Planar Waveguide (GCPW) line 100 with a dielectric slab 102 having a dielectric constant (εr) of 100. The slab 102 may operate as a perfect magnetic conductor (PMC) wall. The dielectric slab 102 may be placed on a top side of the GCPW line 100 as depicted. By varying a distance between the GCPW line 100 and the dielectric slab 102, the propagation constant of the transmission line may be changed. The distance between the GCPW line 100 and the dielectric slab 102 is shown as a gap ($\Delta_z$). It will be appreciated that this structure may be comprehensively analyzed in and employed as a phase shifter.

Figure 2A:
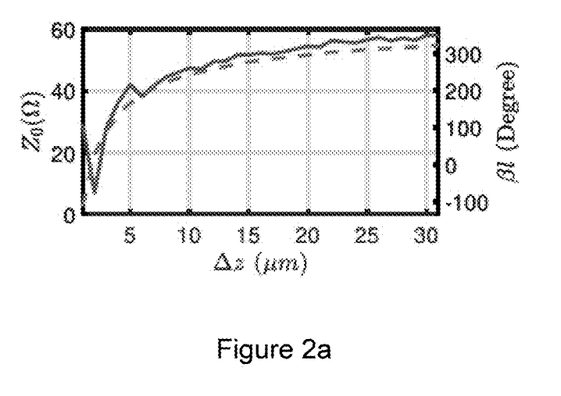
FIG. 2a depicts a characteristic impedance ($Z_0$) and electrical length variation ($\beta l$) of the GCPW line with the dielectric slab.
Figure 2B:
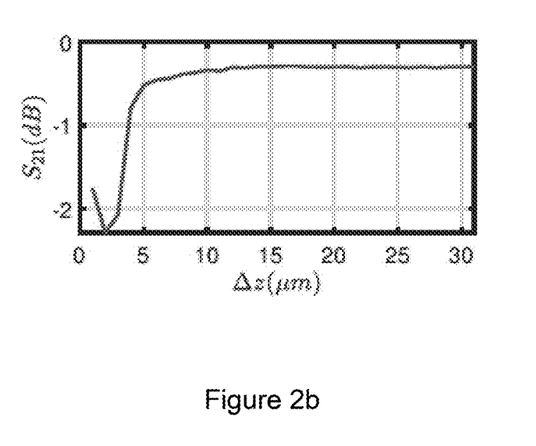
FIG. 2b depicts an insertion loss of the line.

FIG. 2a depicts a characteristic impedance ($Z_0$) and electrical length variation ($\beta l$) for a distance between the GCPW line 100 and the slab 102 of 1 µm to 30 µm ($\Delta_z$=β1 m to $\Delta_z$=30 µm) at 30 GHz (analyzed in ANSYS-HFSS). FIG. 2a shows that when the distance or gap is 5 µm to 30 µm, the electrical length of the line varies from about 160° to about 322° and the characteristic impedance of the line remains relatively constant. FIG. 2b shows an insertion loss of the GCPW line 100. The scattering parameter ($S_{21}$) is −0.5 dB when the gap or distance is 5 µm to 30 µm at 30 GHz (analyzed in ANSYS-HFSS).

Figure 3:
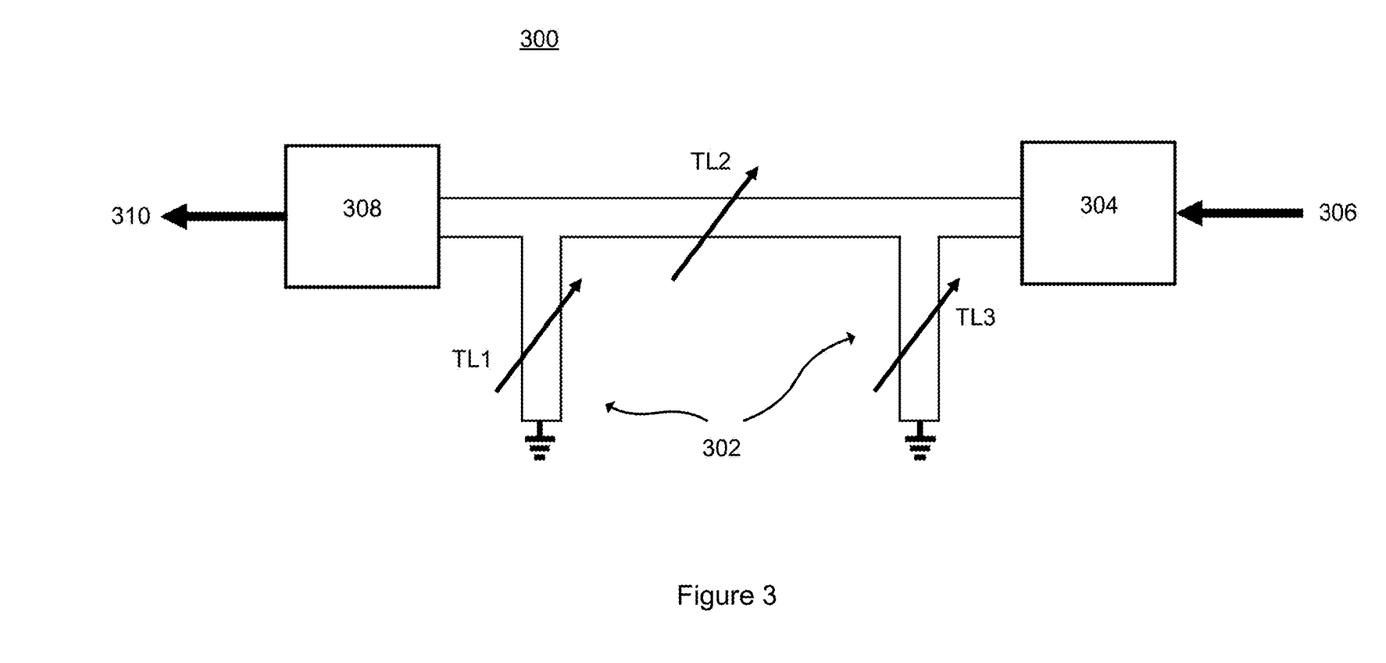
FIG. 3 depicts an embodiment of a tuner.

FIG. 3 depicts an embodiment of a tuner 300. The tuner 300 may be a double-stub matching network with stubs 302. It will be appreciated that the double-stub matching network may be used to maximize the transformation ratio. The tuner 300 comprises lines TL1, TL2, and TL3, and connectors 304 and 308. The connector 304 may be a south west male connector which connects to a PNA port 306, and the connector 308 may be a south west female connector which connects to a GSG probe 310. It will be appreciated that the connector 308 can remove extra adaptor loss due to GSG probes. The structure of the tuner 300 may be designed to connect directly to the GSG probe 310. This may allow for the extra cable loss, such as 3-4 dB of cable loss, to be omitted in existing load-pull tuner systems.

One or more of the lines TL1, TL2, and TL3 may be tunable lines. The lines TL1 TL2, and TL3 may be made of GCPW lines. The tuner 300 may then be loaded with a high permittivity dielectric slab.

It will appreciated that using tunable GCPW lines in a double-stub matching circuit may transform a 50Ω load into any desired point in the Smith-Chart. This can be achieved by changing the electrical length of the stubs 302 and/or the line TL2. The effective electrical length of each stub 302 may change by adjusting the gap between the line TL1 or TL3 and the dielectric slab. Similarly, the electrical length of the line TL2 may be changed by adjusting the gap between the line TL2 and the dielectric slab. It will be appreciated that these gaps are similar to the gap or distance described with regard to FIGS. 1a and 1b. The adjustment means for the gap between the dielectric slab and at least the stubs 302 is further described below.

As depicted in FIG. 3, stubs 302 may be two grounded stubs, such as 7 mm long grounded stubs. As described above, the stubs 302 may be loaded with the high permittivity dielectric. In an embodiment, the high permittivity dielectric may have a dielectric constant ($\varepsilon_r$) of 100, and the gap between each stub and the dielectric may vary from 5 µm to 30 µm. The transmission line substrate may be RO4350 with a dielectric constant ($\varepsilon_r$) of 6.15 and tan δ=0.003. It will be appreciated that the dielectric slab may have different properties and a different constant, the lines may be formed of another suitable transmission line substrate, and/or the gap between the stubs and the dielectric slab may be larger or smaller.

Figure 4A:
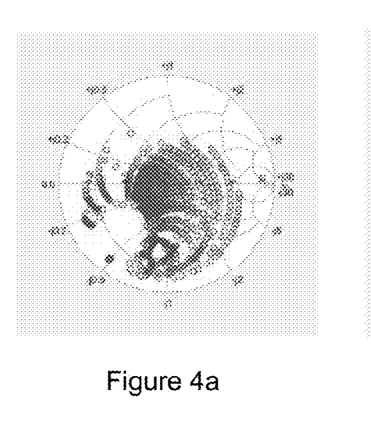
FIG. 4a depicts a response at 30 GHz of an embodiment of the tuner.

FIG. 4a shows a response at 30 GHz of the embodiment described above, when lines TL1 and TL3 are tunable high permittivity dielectric loaded GCPW lines, and TL2 is a straight unloaded GCPW line.

Figure 5A:
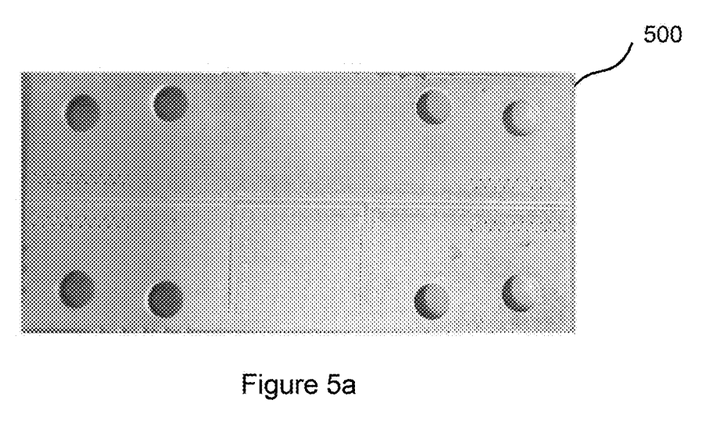
FIG. 5a depicts an embodiment of a double-stub matching network on an RO4360 substrate.
Figure 5B:
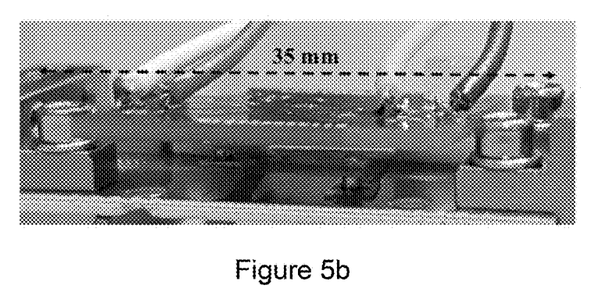
FIGS. 5b-5d depict the double-stub matching network of FIG. 5a with a dielectric slab.
Figure 5C:
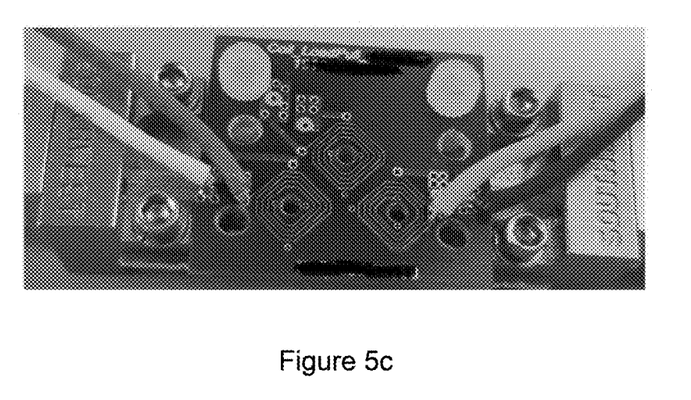
Figure 5D:
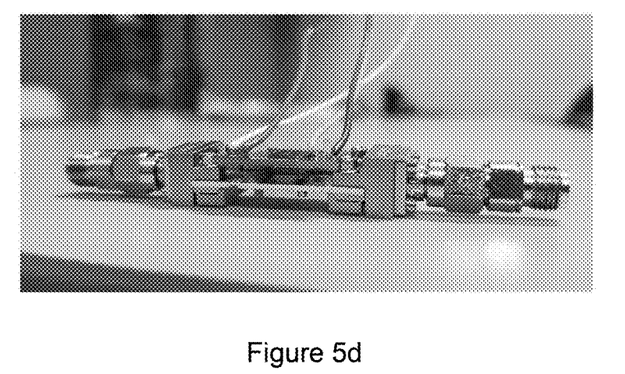

FIG. 5a depicts an embodiment of a double-stub matching network 500 on an RO4360 substrate. The whole structure of the double-stub matching network 500 on RO4360 substrate may have a length of 35 mm, may directly connect to a GSG probe and may operate as a tuner. The double stub matching network 500 may be similar to the tuner 300, comprising three lines (TL1, TL2, and TL3), that may be GSPW lines. A dielectric slab may be loaded onto the double stub matching network 500 such that there is a dielectric for each transmission line of the network. The gap or distance between the lines of the double stub matching network 500 and the dielectrics may be adjusted. To adjust the distance or gap, an actuator may be used for each dielectric. In an embodiment, a magnetic actuator may be used to move the high permittivity dielectrics up and down as shown in FIGS. 5b, 5c, and 5d.

Figure 5E:
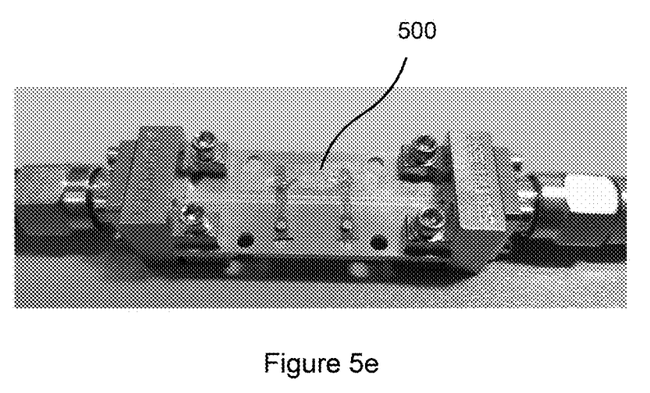
FIG. 5e depicts a bottom view of the double-stub matching network on an RO4360 substrate.

As recited above, there may be an actuator for each line or dielectric. In the system of FIGS. 5a-5d, the double stub matching network 500 has two tunable lines (TL1 and TL3), where each tunable line is loaded with a dielectric, and the gap between each line and dielectric is adjustable by an actuator. In embodiments where the actuators are magnetic actuators, the distance between the dielectric and the GCPW line surface may be adjusted by changing the current in the coils. It will be appreciated that there is an additional dielectric and actuator when the double stub matching network 500 has three tunable lines (TL1, TL2, and TL3). The actuators may be controlled through a digitally controlled current source. FIG. 5e depicts a bottom view of the double-stub matching network 500 on the RO4360 substrate.

Figure 6A:
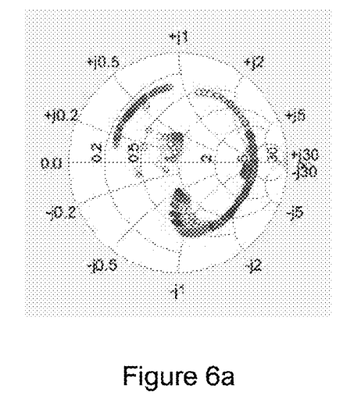
FIGS. 6a-6d depict a measured scattered parameter at various frequencies of the tuner with the magnetic actuators shown in FIGS. 6a-6e.
Figure 6B:
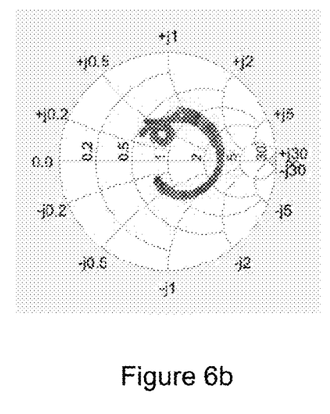
Figure 6C:
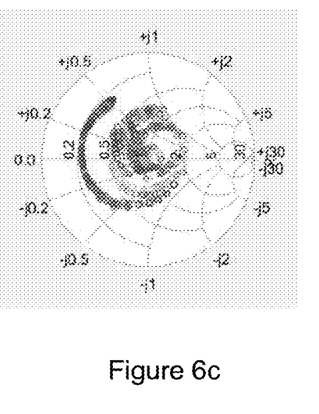
Figure 6D:
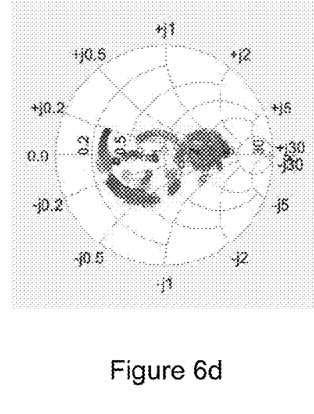

FIGS. 6a-6d depict a measured scattered parameter ($S_{11}$) at various frequencies of the tuner using magnetic actuators shown in FIGS. 5a-5e (measured using a two-port test). A maximum reflection coefficient (|Γ|) of 0.71 is measured at 24.6 GHz as shown in FIG. 6a. A maximum reflection coefficient (|Γ|) of 0.35 is fully covered at 35 GHz as illustrated in FIG. 6c and a resistive impedance of 15Ω to 250Ω is achieved at 40 GHz. It will be appreciated that with only two tunable lines in the tuner of FIGS. 5a-5e, the coverage is limited to a maximum reflection coefficient (|Γ|) of 0.7 and may not cover the entire Smith-Chart.

It will be appreciated that in cases of two tunable lines, the coverage of the Smith-Chart is limited and there are certain blind spots (see FIG. 4a). This may be due to a problem with double-stub tuners where all the loads may not be matched for fixed stub spacings. To avoid such limitations, the straight unloaded GCPW line TL2, described above in the double stub matching network, may be replaced with a tunable GCPW line.

It will be further appreciated that higher loss of the conductor due to surface roughness, and the alignment inaccuracy in moving the dielectrics are among the factors that may also limit the Smith-Chart coverage of the tuner with two tunable lines. More coverage may be achieved by using a GCPW line with lower loss substrate, a conductor with less surface roughness, and a carefully optimized design.

As described above, in order to maximize the coverage of the Smith-Chart, the double stub matching network may comprise a tunable line for TL2. In such a case, the tunable lines TL1, TL2, and TL3 are made of GCPW lines which are loaded with a high permittivity dielectric slab. In such an embodiment, there is a dielectric for each tunable line (TL1, TL2, and TL3) and there may be an actuator for each dielectric to adjust the gap between each line and dielectric.

Figure 4B:
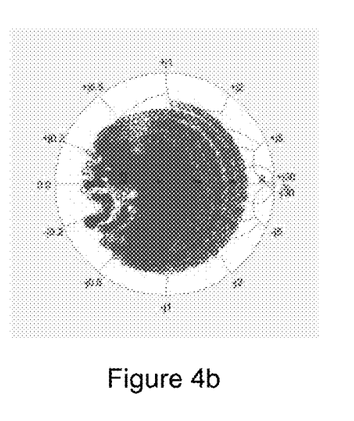
FIGS. 4b, 4c, and 4d depict a reflection coefficient at 20, 30 and, 40 GHz, respectively, for another embodiment of the tuner.
Figure 4C:
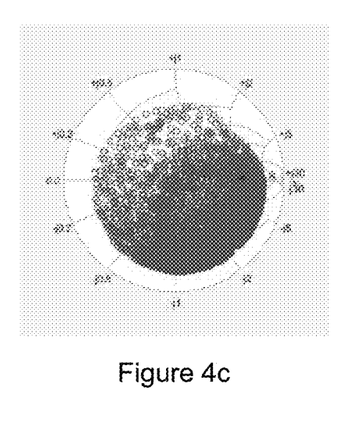
Figure 4D:
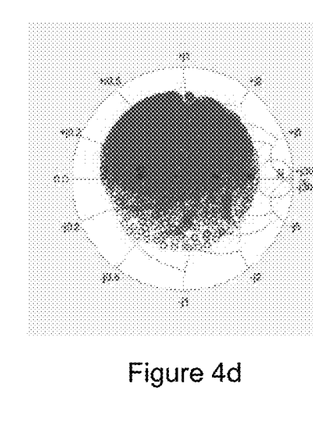

FIGS. 4b, 4c, and 4d depict a reflection coefficient at 20, 30 and, 40 GHz, respectively, of an embodiment of a tuner with three tunable lines (TL1, TL2, and TL3). It will be appreciated, that as depicted in FIGS. 4b-4d, a Smith-Chart coverage of $|\Gamma_{in}|<0.8$ may be achieved over a wide bandwidth using tunable GCPW lines TL1, TL2, and TL3. It will be further appreciated that the substrate and ohmic loss of the line may limit the maximum achievable reflection coefficient.

As described, a tuner having three tunable lines (TL1, TL2, and TL3) may cover the Smith-Chart with a reflection coefficient $(|\Gamma|)<0.8$ over a wide bandwidth. It will be appreciated that a reflection coefficient of 0.7 (Voltage Standing Wave Ratio (VSWR)=5.6) and 0.6 (VSWR=4) is measured at 24.6 GHz and 40 GHz, respectively.

The above described tuner with three tunable lines TL1, TL2, and TL3 may be used as a Ka-band load-pull tuner. The tuner may have a low-cost, and may be a compact solution for Ka-band load-pull tuners. The tuner may be used for phased-array system characterization at higher reflection coefficients. A π-network with three tunable transmission lines may be used to cover the entire Smith-Chart over a wide bandwidth. The system may cover the Smith-Chart with a reflection coefficient at the load $(\Gamma_L)<0.9$. It will be appreciated that the tuner having three tunable lines TL1, TL2, and TL3 may be used for testing a phased-array transmitter chip under impedance mismatch conditions.

The above described tuner may be used for microwave, mm-wave and sub-millimeter-wave systems. The compact design allows such a tuner with three tunable lines to be used for on-wafer probing and may remove any extra cable in the path of the signal.

It would be appreciated by one of ordinary skill in the art that the system and components shown in the figures and described herein may include components not shown in the drawings. For simplicity and clarity of the illustration, elements in the figures are not necessarily to scale, are only schematic and are non-limiting of the elements structures. It will be apparent to persons skilled in the art that a number of variations and modifications can be made without departing from the scope of the invention as described herein.

The invention claimed is:

1. A tuner comprising:
a transmission line network comprising a main transmission line and two stubs connected to the main transmission line, wherein the two stubs are transmission lines and wherein the main transmission line and the two stubs are tunable transmission lines; and
dielectrics positionable above the transmission line network, wherein the dielectrics include a dielectric for each of the main transmission line and the two stubs.

2. The tuner of claim 1, further comprising a connector for directly connecting to a ground probe.

3. The tuner of claim 1, further comprising a connector for connecting to a port.

4. The tuner of claim 1 for phased-array system characterization.

5. The tuner of claim 1, wherein the main transmission line and the two stubs are tunable by changing an electrical length of each of the main transmission line and the two stubs.

6. The tuner of claim 5, wherein the electrical length of each stub is changed by varying a distance between a dielectric positioned above a respective stub and the respective stub.

7. The tuner of claim 6, wherein the distances is varied by an actuator.

8. The tuner of claim 5, wherein the electrical length of the main transmission line is changed by varying a distance between a dielectric positioned above the main transmission line and the main transmission line.

9. The tuner of claim 8, wherein the distance is varied by an actuator.

10. A load pull system for phased-array system characterization, the load pull system comprising
a tuner for maximizing coverage of a Smith-Chart, the tuner comprising:
a transmission line network comprising a main transmission line and two stubs connected to the main transmission line, wherein the two stubs are transmission lines and wherein the main transmission line and the two stubs are tunable transmission lines; and
dielectrics positionable above the transmission line network, wherein the dielectrics include a dielectric for each of the main transmission line and the two stubs.

11. The load pull system of claim 10, further comprising a connector for directly connecting to a ground probe.

12. The load pull system of claim 10, further comprising a connector for connecting to a port.

13. The load pull system of claim 10, wherein the system is for testing a phased-array transmitter.

14. The load pull system of claim 10, wherein the main line and the two stubs are tunable by changing an electrical length of each of the main transmission line and the two stubs.

15. The load pull system of claim 14, wherein the electrical length of each stub is changed by varying a distance between a dielectric positioned above a respective stub and the respective stub.

16. The load pull system of claim 15, wherein the electrical length of the main transmission line is changed by varying a distance between a dielectric positioned above the main transmission line and the main transmission line.

* * * * *